United States Patent [19]

Tobias

[11] Patent Number: 4,476,216
[45] Date of Patent: Oct. 9, 1984

[54] METHOD FOR HIGH RESOLUTION LITHOGRAPHY

[75] Inventor: Eric Tobias, San Jose, Calif.

[73] Assignee: Amdahl Corporation, Sunnyvale, Calif.

[21] Appl. No.: 521,941

[22] Filed: Aug. 9, 1983

Related U.S. Application Data

[63] Continuation of Ser. No. 289,476, Aug. 3, 1981, abandoned.

[51] Int. Cl.$^3$ .............................................. G03C 5/00
[52] U.S. Cl. .................................. 430/296; 427/43.1; 430/311; 430/313; 430/326
[58] Field of Search ............... 430/296, 326, 311, 313, 430/314, 316, 318; 427/43.1

[56] References Cited

U.S. PATENT DOCUMENTS

| | | | |
|---|---|---|---|
| 4,093,461 | 6/1978 | Loprest et al. | 430/326 |
| 4,278,754 | 7/1981 | Yamashita et al. | 430/326 |
| 4,289,845 | 9/1981 | Bowden et al. | 430/296 |

*Primary Examiner*—Mary F. Downey
*Attorney, Agent, or Firm*—Fliesler, Dubb, Meyer & Lovejoy

[57] ABSTRACT

A method for performing high resolution lithography. The first step involves disposing on a substructure having a surface layer to be patterned a layer of a resist material characterized by both substantial degradation sensitivity for incident ionizing radiation of a predetermined type and substantial instability of undegraded regions for a predetermined plasma etchant which attacks the surface layer. The next step is to expose a prearranged pattern of regions of the resist layer to the predetermined type of radiation to produce a corresponding pattern of degraded resist regions. Then the pattern of degraded resist regions is removed using a preselected developing solution. The next step is to modify the resist material to increase the stability thereof for the plasma etchant by exposing the developed resist layer to ionizing radiation of a type which has been predetermined to degrade the resist material and then baking the degraded resist layer. The final step is to etch the exposed regions of the surface layer using said plasma etchant.

8 Claims, 16 Drawing Figures

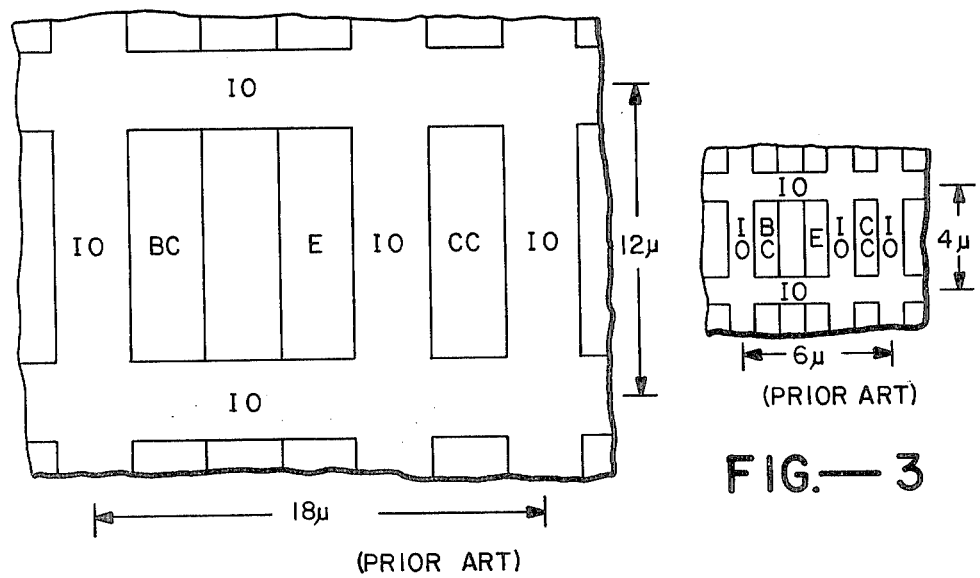
FIG.—1 (PRIOR ART)
FIG.—3 (PRIOR ART)
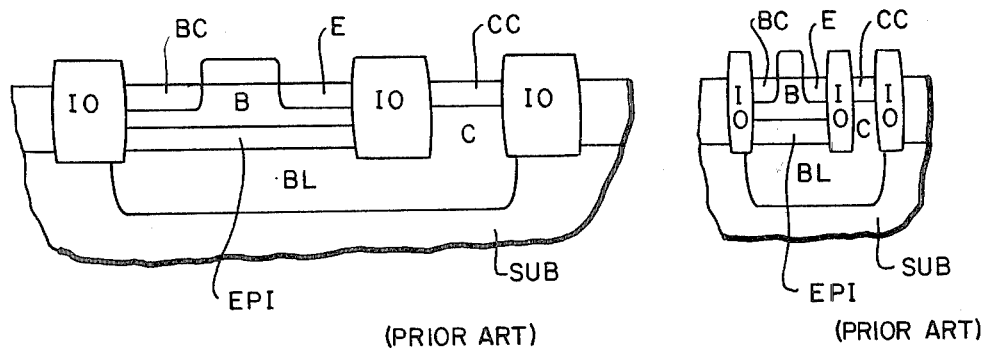
FIG.—2 (PRIOR ART)
FIG.—4 (PRIOR ART)
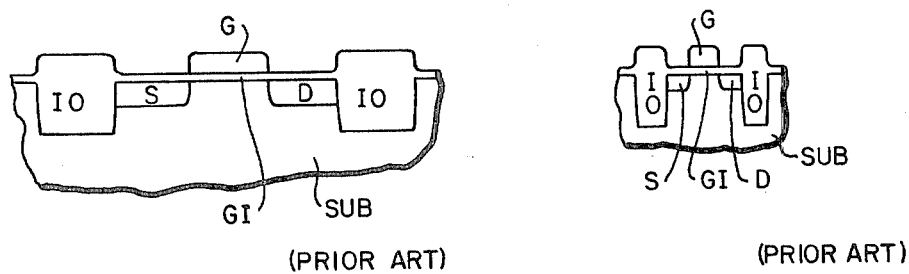
FIG.—5 (PRIOR ART)
FIG.—6 (PRIOR ART)

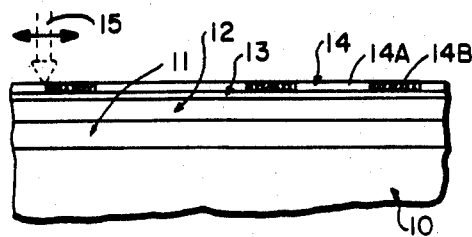
FIG.—7 (PRIOR ART)
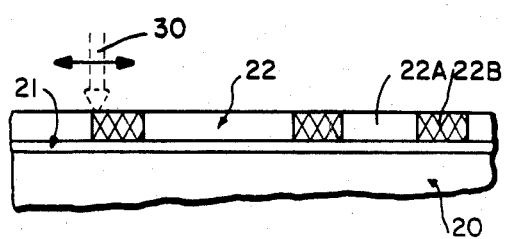
FIG.—13
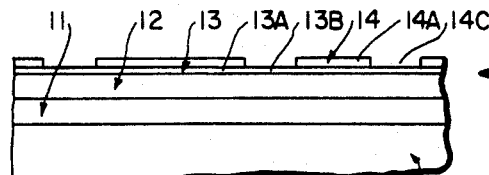
FIG.—8 (PRIOR ART)
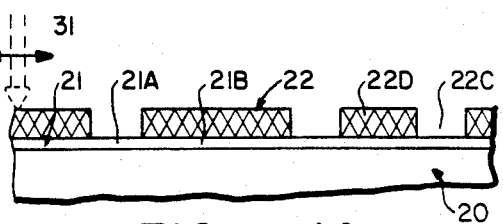
FIG.—14
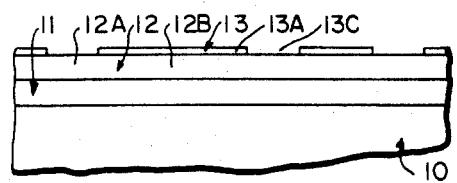
FIG.—9 (PRIOR ART)
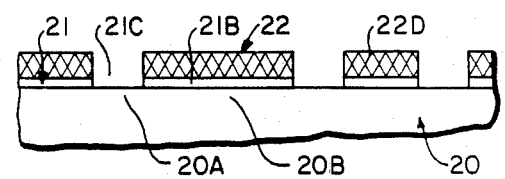
FIG.—15
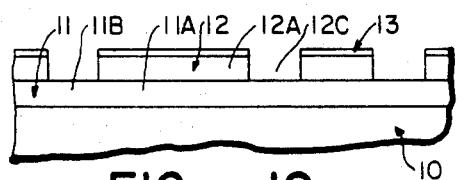
FIG.—10 (PRIOR ART)
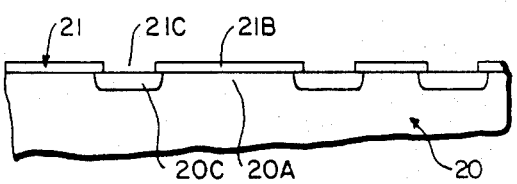
FIG.—16
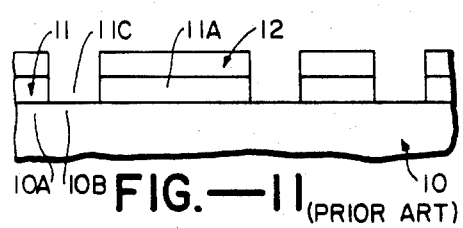
FIG.—11 (PRIOR ART)
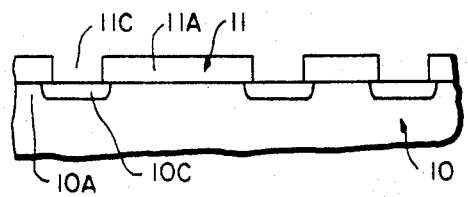
FIG.—12 (PRIOR ART)

METHOD FOR HIGH RESOLUTION LITHOGRAPHY

This application is a continuation of Eric Tobias, "Method for High Resolution Lithography", Ser. No. 289,476, filed Aug. 3, 1981.

This invention relates generally to high resolution lithography and specifically to high resolution electron beam lithography on semiconductor wafers using positive electron beam resist.

The invention disclosed in this application relates generally to lithography for patterning a surface layer on any substrate. However, for purposes of illustration, but not of limitation on the application of the invention, the discussion and description thereof will be given in the context of lithography used in processing semiconductor wafers into integrated circuits.

Integrated circuit (IC) technologies for manufacturing conductor-insulator-semiconductor field effect transistor (CISFET) devices and bipolar transistor devices involve the formation of a large number of individual transistors and related circuit elements (such as resistors and capacitors) on the same integrated circuit chip. Furthermore, a large number of identical chips are typically fabricated simultaneously on a single semiconductor wafer. Over the past several years, the level of integration of devices on individual chips has increased dramatically. One important contributor to achieving increased levels of device integration has been improvements in several aspects of lithography technology which is at the heart of all semiconductor IC processing. Improvements in lithography have occurred in equipment, materials, and related lithography process techniques.

The mainstay of lithography in semiconductor processing has been photolithography or optical lithography. Processing of a semiconductor wafer into integrated circuits generally involves anywhere from five or six photolithography steps to as many as fifteen or twenty such steps. An example of a sequence of photolithography steps to produce a bipolar transistor is shown in a copending and commonly assigned application of Ping-Wang Chiang and entitled "System for Providing Photomask Alignment Keys in Semiconductor Processing", Ser. No. 222,257, filed Jan. 2, 1981 now U.S. Pat. No. 4,343,878. For many years photolithography processing utilized negative photoresist material and optical masks and exposure systems. The typical photolithography process involves forming a layer of photoresist material on a surface layer of a semiconductor wafer. Typically the surface layer is a layer of a masking material which, after patterning, will be utilized as a mask while etching the surface of the semiconductor wafer or while introducing conductivity modifying impurities into localized regions of the wafer. Then an optical photomask containing a pattern of transmissive and opaque layers is placed on the photoresist layer and an appropriate light source is utilized to expose the resist through the photomask. For negative photoresist the opaque areas in the photomask correspond to areas of the photoresist layer which are to be developed away, consequently the designation negative photoresist. After exposure of the resist through the photomask, the unexposed areas are developed away utilizing a selected developing solution. This leaves exposed areas of the surface layer on the wafer which may then be etched using the patterned photoresist layer as an etching mask. After this etching step, the topographical pattern of the light transmitting areas on the optical photomask has been reproduced in the layer of masking material. This patterned masking layer may then be utilized either for etching the semiconductor wafer itself or diffusing or implanting conductivity modifying dopant atoms into the wafer.

One of the early improvements in photolithography involves the development of positive photoresist materials which could be utilized with positive photomasks having opaque areas corresponding to the regions of the photoresist and the underlying surface layer which were to remain on the substrate. In other words, positive photoresist involves exposing the regions of the photoresist to be removed through light transmissive areas of the photomask and then developing away the exposed areas leaving a positive pattern corresponding to the photomask. Generally, positive resist photolithography enabled higher resolution to be achieved and thus contributed to an increase in IC device integration levels.

In addition to resolution improvements achieved through the use of positive photoresist, other improvements in resist material systems, mask making, exposure systems and etching technology have contributed to improvements in the resolution of photolithography. These improvements in resolution enabled corresponding reductions in minimum photolithography feature size in the design of integrated circuits and corresponding increases in levels of device integration. One of the more recent improvements in photolithography technology was the development of plasma etching systems (also called dry etching) to replace former wet chemical etching techniques. Wet chemical etching techniques are inherently isotropic and some of the etchants which must be employed in wet chemical etching systems are dangerous from a standpoint of toxicity and flammability. Plasma etching systems have been developed to provide directional etching which improves the overall resolution of the photolithography steps in a semiconductor process. Furthermore, plasma etching equipment is generally a closed system involving less danger to processing personnel.

In addition to the development of plasma etching systems, other improvements which have resulted in higher resolution photolithography include projection photomask aligning and exposure systems and improvements in photoresists and exposure systems using shorter wavelength, deep ultraviolet light to achieve higher resolution. In addition, resolution improvements in mask making have been achieved utilizing electron beam lithography to produce chromium on glass photomasks. Electron beam lithography for photomask making was made possible by the development of electron beam resist materials, i.e. resist materials which could be written by exposure to a highly focused electron beam scanned with appropriate modulation over the photoresist material to produce an electron beam exposure pattern in the resist.

With all of the improvements in optical photolithography which have occurred, there remains a limit on the resolution which can be achieved in volume IC production utilizing this lithography technique. Generally for optical photolithography systems, the minimum photolithography feature size or minimum line width has been in the range of two to three microns for production technologies. Accordingly, further research and development efforts in IC lithography systems have concentrated on the development of higher resolution lithography utilizing resist materials which can be written with shorter wavelength electromagnetic radiation. The initial success achieved in utilizing electron beam lithography to make chromium photomasks has led to development of "direct write on wafer" lithography systems utilizing a highly focused electron beam which is scanned with respect to a semiconductor wafer carrying a layer of electron beam resist material. Such "direct write on wafer" systems are capable of producing minimum photolithography feature sizes in the submicron region. Consequently substantial research and development efforts are being expended to develop electron beam and other high resolution lithography systems capable of achieving submicron lithography in an overall system which is sufficiently economic for large volume fabrication of very dense IC devices.

The increased level of device integration which can be achieved by going from lithography design rules involving three micron feature sizes to one micron feature sizes is illustrated in FIGS. 1 through 6 of the accompanying drawings. In a copending and commonly assigned patent application of Ping-Wang Chiang entitled "Semiconductor Integrated Circuit Devices and Methods of Manufacture", Ser. No. 230,314, filed Feb. 2, 1981, a method for virtually zero encroachment oxide isolation is described. The devices depicted in FIGS. 1 through 6 constitute idealized bipolar and field effect transistor devices based on such zero encroachment isolation regions. FIGS. 1 and 2 show schematically the topography and a cross-section view of the topology of a bipolar device (prior to forming metal contacts and interconnects) constructed with three micron design rules and a 3:1 ratio of length to width of diffused regions. The particular type of bipolar device depicted has been called a "three side wall emitter" bipolar device and the following code has been employed in designating the various regions of that device:

| CODE | REGION |
| --- | --- |
| SUB | Substrate |
| EPI | Epitaxial Layer |
| IO | Isolation Oxide |
| BL | Buried Layer |
| B | Base |
| C | Collector Diffusion |
| CC | Collector Contact |
| E | Emitter |
| BC | Base Contact |

FIG. 1 illustrates that an ideal bipolar transistor utilizing isolation oxide regions formed utilizing the Ping-Wang Chiang process disclosed in the above-referenced copending application and using three micron design rules will have dimensions of twelve microns by eighteen microns for a total device area of 216 square microns. FIGS. 3 and 4 depict the same type of bipolar device constructed using one micron design rules. Here the ideal transistor has a dimension of four microns by six microns and occupies an area of 24 square microns. Generally about nine of the FIG. 3 devices could be fabricated in the same chip area of one of the FIG. 1 devices.

FIGS. 5 and 6 illustrate schematically the improvements in device size which can be achieved in CISFET technology in going from three micron design rules in FIG. 5 to one micron design rules in FIG. 6. In these figures, the following code has been used in designating the various topological regions on the wafer:

| CODE | REGION |
| --- | --- |
| SUB | Substrate |
| IO | Isolation Oxide |
| S | Source |
| D | Drain |
| G | Gate |
| GI | Gate Insulation |

In general, a three-fold improvement in lithography resolution will enable a three-fold to nine-fold improvement in device integration levels. Although ideal transistor topography and topology cannot be achieved because of the requirements to design in tolerances for mask and/or wafer alignment and the like, use of ideal transistor topographies is meaningful for relative transistor area comparisons using different sizes of minimum photolithography features.

The ultimate utility of a resist material depends on various material parameters such as film-forming properties, resistance to etchant materials, writing sensitivity, and adhesion to the underlying layer to be patterned. In particular, to achieve high resolution lithography on a basis which is economic for large volume manufacture, an electron beam resist material must have both good writing sensitivity and relatively high resistance to typical plasma etchants, which latter property is also sometimes called good plasma stability. There are currently available negative electron beam resist materials which have sufficient sensitivity and good plasma stability. However negative resists are generally not as good as positive resists from the standpoint of lithography resolution. Consequently, achievement of the high resolution capabilities of direct write electron beam lithography essentially demands the use of a positive type electron beam resist.

Negative electron beam resists are generally low molecular weight polymer materials which crosslink under electron irradiation. In general low molecular weight materials have a higher density and tend to have good plasma stability. On the other hand, positive electron beam resist materials are generally higher molecular weight polymers which degrade under electron irradiation and the degraded regions are dissolved away utilizing a developing solution, leaving regions of high molecular weight unexposed resist material which have relatively low plasma stability. The two most widely known positive electron beam resist materials are Poly(methyl methacrylate) (hereinafter called PMMA) and Poly(olefin sulfone) materials, in particular Poly(butene-1 sulfone) (hereinafter designated PBS). PMMA is a lower molecular weight material than PBS. The plasma stability of undegraded PMMA is thus greater than that of PBS, but the writing sensitivity of PMMA is substantially less than that of PBS. Thus, while PBS is a preferred electron beam resist for speed in writing the circuit topography pattern on the resist layer, the plasma stability of PBS is so poor that the sufficiently thin layers thereof required for high resolution lithography cannot be utilized in a standard lithography process with plasma etching because the layer of resist will be etched away before the underlying layer to be patterned is etched through by the plasma etchant.

In order to utilize PBS and achieve the resolution capabilities of electron beam lithography utilizing that resist material, the prior art has suggested the use of a trilayer masking process generally depicted in FIGS. 7-12 of the accompanying drawings. As shown in FIG. 7 this three layer masking process involves the formation of a layer 12 of optical photoresist on top of a surface layer 11 which has been formed on a semiconductor wafer 10. (It is the surface layer 11 which is ultimately to be patterned for purposes of etching the substrate 10 or introducing conductivity modifying impurities into surface regions or subsurface regions thereof.) On top of the layer of optical photoresist 12, which may be one to three microns thick, is formed a very thin layer of a conductive material such as germanium or polysilicon. On top of the layer 13 of conductive material is formed a layer 14 of PBS. The PBS layer 14 may for example be around 2,000 Angstroms in thickness.

The next step is to irradiate the PBS layer 14 with a scanning electron beam which is modulated as it scans to cause irradiation of only selected regions of the resist layer 14. The darkened regions such as the one designated 14B denote regions which have been irradiated with electrons whereas the undarkened region such as the region designated 14A denotes a region which has not been irradiated. The degraded regions 14B may be removed utilizing a developing solution of an appropriate type.

FIG. 8 depicts generally the cross-sectional appearance of the semiconductor wafer section after the degraded areas 14B of resist layer 14 in FIG. 7 have been developed away, producing windows such as 14C which expose areas such as 13B in the underlying conductive layer 13. Adjacent regions 13A of the conductive layer 13 lie under remaining regions 14A of the photoresist layer 14. To pattern the conducting layer 13, a plasma etching step is carried out and, thereafter, the remaining portion of the electron resist layer 14 is removed. The resulting structure is as depicted in FIG. 9 wherein the windows such as 13C in the layer 13 correspond to the exposed regions 13B shown in FIG. 8. The next step is to pattern the optical photoresist layer 12 by removing regions 12A exposed through the windows 13C in the conductive layer 13. This may be done utilizing a directional plasma etching step utilizing a plasma etchant which quickly attacks exposed regions 12A of the optical photoresist layer 12 but only slowly attacks the conductive layer 13.

Having patterned the layer of optical resist 12, the underlying layer of masking material 11 may be patterned using another plasma etching step, thereby producing a pattern of windows 11C and remaining masking layer regions 11A on the substrate 10. Then the optical photoresist may be removed utilizing a photoresist washing step, leaving the final patterned masking layer 11 as shown in FIG. 12. This patterned masking layer 11 may then be utilized to perform some type of process step on the semiconductor wafer 10 itself such as forming the doped regions 10C in a diffusion or ion implantation process.

From the above description, it can be seen that the prior art process involves three separate etching steps plus the additional steps required to remove the patterned conductive layer and the intermediate layer of optical resist. Thus, while this modified three-layer masking process achieves high resolution lithography, it has the disadvantage of process complexity which ultimately results in lowering of process yields in IC manufacture. In particular, this three-layer masking process is highly sensitive to achieving a pinhole free, thin conductive layer 13, since pinholes in that layer will be reproduced into the optical photoresist layer and also into the ultimate masking layer 11.

It is the principal object of this invention to provide an improved method for high resolution lithography.

It is another object of this invention to provide a method for high resolution lithography which utilizes mainly standard lithography process steps.

It is another object of this invention to provide a method for high resolution electron beam lithography utilizing high sensitivity positive electron beam resists.

It is further object of this invention to provide a method for electron beam lithography which can achieve high resolution in an economical semiconductor process.

The objects of this invention are generally achieved in a method for performing high resolution lithography which involves first disposing on a substructure having a surface layer to be patterned a layer of resist material characterized by both substantial degradation sensitivity for incident ionizing radiation of a predetermined type and substantial instability of undegraded regions for a predetermined plasma etchant which attacks the surface layer. Thereafter, a prearranged pattern of regions of the resist layer is exposed to the predetermined type of radiation to produce a corresponding pattern of degraded resist regions. The degraded resist regions are then removed using a preselected developing solution, after which the developed resist layer is treated to modify the resist material to have substantially increased stability for the plasma etchant. Thereafter, the exposed regions of the surface layer are etched utilizing the predetermined plasma etchant.

In a particular process the step of treating the developed resist layer comprises exposing the developed resist layer to ionizing radiation of a type which has been predetermined to degrade the resist material and then baking the degraded resist material to densify it. Where the resist material is Poly(butene-1 sulfone), the step of exposing the developed resist layer may be carried out by scanning the developed layer with a beam of electrons having energies in the range between about 5 kev and 25 kev and producing a dose in the range between about $6 \times 10^8$ to $46 \times 10^8$ coulombs/centimeter$^2$. The step of baking the degraded layer PBS may be carried out at about 120° C. for about 15 minutes.

Where PBS is utilized to pattern a layer of silicon dioxide masking material formed to a thickness of about one micron, the PBS may be formed to a thickness in the range of about 3,000 to 5,000 Angstroms. The same thickness of PBS resist may also be utilized to pattern a layer of silicon nitride having a thickness of about 1,000 Angstroms. The same thickness of resist may also be utilized to pattern a conductive layer with a thickness of about one micron. It should be understood however that the method of this invention is generally applicable to resist materials which may be degraded by bombardment with ionizing radiation and densified by baking the degraded resist layer. It should also be understood that the invention is not limited to any particular thickness of resist and the resist thickness will generally be tailored to the plasma stability of the resist for the particular plasma etchant to be utilized and the thickness of the underlying surface layer.

From the above description of the objects and features of this invention, it should be apparent that numerous advantages are achieved by enabling the resist material to be formed directly on the substructure layer to be patterned in the lithography operation. This eliminates a number of the process steps involved in prior art methods to achieve high resolution lithography with the same resist materials each of which has a potential yield loss associated with it. The process of this invention introduces only a few additional method steps which can be carried out with virtually no yield loss and, as will later be discussed in detail, which can be carried out with a relatively inexpensive processing equipment. Accordingly, the method of this invention provides an economic approach to achieving high resolution electron beam lithography with positive electron beam resists.

Other objects, features, and advantages of this invention will be apparent from a consideration of the following detailed description taken in conjunction with the accompanying drawings.

FIG. 1 is a fragmented top view of the topography of a bipolar transistor.

FIG. 2 is a fragmented section view of the bipolar transistor depicted in FIG. 1.

FIG. 3 is a fragmented top view illustrating the topography of a bipolar transistor.

FIG. 4 is a fragmented section view of the bipolar transistor depicted in FIG. 3.

FIG. 5 is a fragmented section view of a portion of a field effect transistor structure.

FIG. 6 is a fragmented section view of a portion of a field effect transistor structure.

FIGS. 7-12 illustrate a sequence of steps in a prior art lithography process using positive electron beam resist.

FIGS. 13-16 depict in fragmented cross-section the topography of a semiconductor wafer at various stages of a lithography process in accordance with this invention.

FIGS. 1-12 have been described above in connection with the background of this invention and no further discussion is necessary at this point. It has been known for some time that high molecular weight resists which have good writing sensitivity in response to ionizing radiation (such as a beam of electrons) also have low plasma stability, i.e. the resist is etched at a substantial rate by plasma etchants typically used in semiconductor processing. In particular, it has been known for some time that Poly(butene-1 sulfone) has, among the many electron beam resists, the best combination of resolution, sensitivity, and adhesion. However, as pointed out in an article by Yamazaki, et al. entitled "A Dry Etching Technique Using Electron Beam Resist-PBS", *J. Electrochem. Soc.*, August 1980, page 1859: "The main limitation to PBS is its poor resistance to dry etching environments which (is) attributed to plasma depolymerization which enhances the rate of film loss."

This invention is based on the discovery that the plasma stability of positive resists can be substantially increased by treating the resist to lower the molecular weight and increase the density thereof. For example, it has been discovered that the plasma stability of PBS can be substantially increased by degrading the resist with a sufficient dose of ionizing radiation and then baking the resist to densify it. Analysis shows that the treated and untreated resists have substantially the same index of refraction. Since the refractive index of a compound is a significant indicator of the molecular constitution of that compound, it appears that the treating of the PBS resist to increase its plasma stability only involves a reduction in the molecular weight of the resist material and thus increased density. The increase in plasma stability probably results from a reduced probability of reactive ions in the plasma etchant penetrating the densified resist. This helps to confine the attack by the reactive ions of the etchant plasma to the resist surface layers, thus reducing the rate at which the resist material is depolymerized and etched away.

Whatever the explanation of the discovered phenomena, it has been demonstrated that using the method of this invention, substantial improvements in resist stability can be achieved and high sensitivity resists such as PBS can be used in relatively thin layers to pattern layers of masking material of substantial thickness. For example it has been demonstrated that a layer of silicon of about one micron thickness on a semiconductor wafer can be accurately patterned using a layer of PBS having a thickness of about 4,000 Angstroms and using $CF_4/O_2$ at a 96/4 ratio when the resist modification treatment of this invention is utilized. It has also been demonstrated that a 4,000 Angstrom layer of PBS can be used to accurately pattern a 1,000 Angstrom layer of silicon nitride on a semiconductor surface using a $CF_4/O_2$ plasma mixture in the ratio of 92/8. It has also been demonstrated that a layer of PBS of about 4,000 Angstroms thickness can be utilized to pattern accurately a one micron thick layer of aluminum utilizing a carbon tetrachloride plasma. It has also been demonstrated that a 4,000 Angstrom thick layer of PBS can be utilized to accurately pattern a composite layer of 400 Angstroms of oxide on a semiconductor wafer followed by about 1,000 Angstroms of nitride and 3,300 Angstroms of oxide. Successful, accurate patterning of all of these types of layers with a relatively thin 4,000 Angstrom layer of PBS could be achieved only when the method of this invention was employed, i.e. the initially patterned PBS layer is treated by exposure to ionizing radiation to degrade the remaining resist regions and then baking to densify the resist.

It is anticipated that a 4000 Angstrom layer of PBS may be utilized to pattern at least one-half micron of thermal silicon dioxide and perhaps up to one micron. In this case the etchant would preferably be $CHF_3$ and a reactive ion etch process would be employed.

While this invention is particularly useful with PBS resist, it should be understood that it is generally applicable to resist materials which are characterized by substantial degradation sensitivity for incident ionizing radiation and substantial instability of undegraded regions for typical plasma etchants. As further illustration of the principles of this invention, the details of a typical process for using a PBS treatment step in accordance with this invention will be described in conjunction with FIGS. 13 through 16.

The process starts with a raw silicon wafer 20 which may be for example a p-type, <100>, silicon wafer. The wafer is subjected to the normal initial cleaning steps utilized at the start of a semiconductor process to insure a clean surface. Then a layer of silicon nitride of approximately 1,000 Angstroms thickness is deposited as masking layer 21 on the surface of the wafer 20. This nitride layer is preferably formed by a low pressure chemical vapor deposition using the process set forth in the co-pending and commonly assigned Ping-Wang Chiang application entitled "Low Pressure Chemical Vapor Deposition Of Silicon Nitride Films", Ser. No. 185,294, now U.S. Pat. No. 4,395,438, issued July 26, 1983. Utilizing the apparatus and method disclosed in the referenced Ping-Wang Chiang application, a uniform layer of silicon nitride of about 1,000 Angstrom thickness and having sufficient quality to be utilized as diffusion masking layer may be deposited.

The next step in the process is to form a 4,000 Angstrom thick layer 22 of PBS resist on top of the nitride layer 21. This can be accomplished in the normal photoresist spin-on process utilizing standard apparatus designed for this process step. Generally the methodology involves dispensing a measured volume of the PBS resist on the surface of the nitride coated wafer and spinning the wafer at a predetermined rate to form a uniform coating of the resist. The spinning rate of the wafer determines the ultimate thickness of the resist and the equipment is readily calibrated to produce a specified resist thickness. In this case 4,000 Angstroms of resist is utilized, but it should be understood that there is nothing critical about this resist thickness and, to pattern about 1,000 Angstroms of silicon nitride, resist thicknesses in the range of about 3,000 to 5,000 Angstroms could be utilized.

After the resist layer is spun on the wafer, the wafer is baked to dry the resist and prepare it for writing. This step may be carried out by baking the wafer for about one hour at about 120° C. Thereafter the wafer is cooled to room temperature and is then ready for writing a pattern into the resist utilizing an electron beam exposure system. For example, an Etec MEBES (manufacturing electron beam exposure system) may be utilized to write an electron beam exposure pattern directly on the dried resist layer 22. As shown in FIG. 13 this generally involves the scanning of an electron beam 30 across the surface of the resist layer 22 while blanking and unblanking the beam to produce a pattern of exposed regions 22B and unexposed regions 22A. Exposed regions 22B are the crosshatched regions in FIG. 13 and represent regions where the resist has been degraded by exposure to the ionizing electron beam. In carrying out this process on the Etec MEBES the following electron beam parameters may be utilized: spot size of 0.50 microns, spot current of 40.0 nanoamps, and an accelerating voltage of 10 kilovolts. It should be understood that these parameters are only exemplary of the writing beam parameters which may be utilized, and any set of electron beam parameters and any type of exposure system which is capable of writing a pattern into the resist layer may be utilized.

After the resist layer 22 has been written, the pattern of exposed regions 22B is developed out, using a standard PBS developer and rinse step, for example using a chemical PBS developer and rinse available from KTI Chemicals Inc., 1170 Sonora Court, Sunnyvale, Calif. 94086. As shown in FIG. 14, after the developing and rinse step, windows 22C have been formed in the resist layer 22 at locations corresponding to the degraded regions 22B depicted in FIG. 13. These windows 22C expose regions 21A in the nitride layer 21. Correspondingly, the remaining PBS resist regions 22D mask underlying regions 21B of the nitride layer 21. After the written resist pattern is developed out, the wafer is spun dry and then baked to prepare it for the next process step. The baking may be carried out at about 120° C. for about 30 minutes.

The next step in the process is to treat the remaining regions of resist 22D to increase the plasma stability thereof prior to plasma etching the exposed regions 21A of nitride layer 21. Generally this treatment step comprises exposing the remaining resist regions 22D to a sufficient ionizing radiation dose to degrade the regions and then baking the wafer to densify the degraded resist regions. This step may be carried out by again scanning the entire wafer surface with an electron beam or other ionizing radiation beam which will degrade the resist. Alternatively, the exposure to ionizing radiation may be carried out by flooding the wafer with ionizing radiation of a type which will produce degraded resist regions. Since it is not necessary to write an accurate pattern of degraded regions into the resist at this point, much lower cost electron beam writing equipment could be utilized for this step. For example an electron beam system having a much less highly focused beam could be utilized. In addition to using a scanning electron beam, it should be possible to degrade the resist utilizing gamma rays or x-rays of an appropriate energy and wavelength. Such exposures may be carried out utilizing a flood pattern of x-rays or gamma rays either from radioactive sources or artificial generating equipment.

To demonstrate the principles of the invention, treatment of the resist layer 20 utilizing the same Etec MEBES system was carried out using a 10 kev beam with a spot size of 0.50 microns and a spot current of 33.1 nanoamps. Preferably the dose of ionizing radiation should be in the range of about $6 \times 10^{-8}$ to $46 \times 10^{-8}$ coulombs/centimeter$^2$ but doses generally between $1 \times 10^{-8}$ and $1 \times 10^{-5}$ coulombs/centimeter$^2$ should produce a degradation in the resist without a significant removal of the resist layer.

After the remaining resist regions 22D are treated with ionizing radiation, the wafer is baked to densify the treated resist regions. In the exemplary process, the wafer was baked at 120° C. for about 15 minutes and then cooled to room temperature.

The next step is to etch the exposed nitride regions 21A utilizing an appropriate plasma etchant and commercially available plasma etching equipment. In the exemplary process a Tegal single-in-line parallel-plate plasma etcher was used with the following parameters: forward power of 115 watts, reverse power less than 5 watts, temperature 80° C., gas mixture $CF_4/O_2$ in a 92/8 ratio, pressure of 250 microns and an etch time of 4 minutes. After this step is carried out, the regions 21A of the nitride layer have been removed leaving windows 21C through which surface regions 20A of the wafer 20 are exposed.

The next step is the removal of the treated resist layer. This can be carried out using an acetone bath followed by a 30 minute oxygen plasma treatment to strip the resist from the wafer. This leaves a patterned nitride layer 21 having regions of nitride 21B and windows 21C exposing surface regions 20A of substrate 20. This patterned nitride layer can then be utilized either to etch ditches into the substrate such as is taught in the co-pending Chiang patent application Ser. No. 230,314 referenced above or to form diffused regions in the surface of the wafer 20 as set forth in the above-referenced Chiang application Ser. No. 222,257.

It should be understood that instead of using a single nitride layer 21 as the masking layer on wafer 20 a composite layer of about 300 or 400 Angstroms of oxide followed by about 1,000 Angstroms of nitride could be utilized. In addition, other masking layers such as about one micron of silicon dioxide grown on the surface of wafer 20 could be utilized for diffusion masking purposes.

Contrasting the method of this invention described in connection with FIGS. 13 to 16 with the prior art approach depicted in FIGS. 7 through 12 and described above, it should be apparent that the process of this invention has a number of advantages over the prior art approach. The process of this invention is substantially more simple in terms of the number of process steps and overall process complexity. This will result in a higher process yield and thus overall lower processing costs for producing semiconductor IC devices. The process of this invention enables the high resolution capabilities of high sensitivity electron beam resists such as PBS to be fully utilized without adding critical process steps which produce a substantial yield loss. The treatment of the remaining regions of the resist, carried on the wafer after initial resist patterning has been carried out, is a noncritical step, since there is no criticality in either the step of exposing the resist regions to degrade them or in baking the resist regions to densify them. While the degraded and densified resist regions are somewhat more difficult to remove from the wafer after plasma etching the underlying masking material, use of an acetone bath prior to the typical oxygen plasma stripping operation does not add any substantial cost or risk of yield loss to the process.

While the method of this invention has been described in detail in connection with an exemplary sequence of process steps, it should be understood that numerous changes could be made without departing from the scope of the invention as claimed in the following claims.

What is claimed is:

1. In a method for performing high resolution lithography, the steps of:
   disposing on a substructure having a surface layer to be patterned a layer of a positive electron beam resist material characterized by both substantial degradation sensitivity for incident electron beams and substantial instability of undegraded regions for a predetermined plasma etchant which attacks said surface layer;
   exposing a prearranged pattern of regions of said resist layer to said electron beams to produce a corresponding pattern of degraded resist regions;
   removing said pattern of degraded resist regions using a preselected developing solution to form a developed resist layer;
   modifying said resist material to increase the stability thereof for said plasma etchant by exposing said developed resist layer to paid electron beam and baking said degraded resist layer; and
   etching exposed regions of said surface layer using said plasma etchant.

2. The method of claim 1, wherein; said step of exposing said resist layer comprises scanning a beam of electrons in a prearranged modulated pattern across said resist layer; and said step of exposing said developed resist layer comprises scanning a beam of electrons uniformly over said developed resist layer.

3. The method of claim 2, wherein said electron beam resist is a Poly(olefin sulfone).

4. The method of claim 2, wherein said electron beam resist is Poly(butene-1 sulfone).

5. In a method for forming a high resolution masking layer pattern on a semiconductor wafer, the steps of:
   forming on said wafer a layer of masking material;
   disposing directly on said layer of masking material a layer of electron beam resist material characterized by both substantial degradation sensitivity for electron beam radiation and substantial instability of undegraded regions for a predetermined plasma etchant which attacks said masking material;
   esposing a prearranged pattern of regions of said resist layer to scanning electron beam radiation to produce a corresponding pattern of degraded resist regions;
   removing said pattern of degraded resist regions using a preselected developing solution;
   exposing said developed resist layer to scanning electron beam radiation to degrade said resist material;
   baking said degraded resist material; and
   etching exposed regions of said surface layer using said plasma etchant.

6. The method of claim 5, wherein said step of exposing said resist layer comprises scanning a beam of electrons in a prearranged modulated pattern across said resist layer; and said step of exposing said developed resist layer comprises scanning a beam of electrons uniformly over said developed resist layer.

7. The method of claim 5, wherein said layer of masking material is a layer of silicon formed to a thickness of at least about one micron; said resist material is Poly(butene-1sulfone) formed to a thickness in the range of about 3,000 to 5,000 Angstroms.

8. The method of claim 5, wherein said layer of masking material is a layer of silicon nitride formed to a thickness of about 1,000 Angstroms; and said resist material is Poly(butene-1 sulfone) formed to a thickness in the range of about 3,000 to 5,000 Angstroms.

* * * * *